United States Patent
Dando et al.

(10) Patent No.: US 6,787,373 B2
(45) Date of Patent: Sep. 7, 2004

(54) METHOD OF REPLACING AT LEAST A PORTION OF SEMICONDUCTOR SUBSTRATE DEPOSITION PROCESS KIT HARDWARE, AND METHOD OF DEPOSITING MATERIALS OVER A PLURALITY OF SEMICONDUCTOR SUBSTRATES

(75) Inventors: Ross S. Dando, Nampa, ID (US); Craig M. Carpenter, Boise, ID (US); Philip H. Campbell, Meridian, ID (US); Allen P. Mardian, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/396,268

(22) Filed: Mar. 24, 2003

(65) Prior Publication Data

US 2003/0192477 A1 Oct. 16, 2003

Related U.S. Application Data

(60) Division of application No. 10/163,671, filed on Jun. 5, 2002, now Pat. No. 6,620,253, which is a continuation-in-part of application No. 10/121,302, filed on Apr. 11, 2002, now Pat. No. 6,613,587.

(51) Int. Cl.⁷ ............................................. H01L 21/00
(52) U.S. Cl. ........................ 438/4; 438/680; 438/778; 118/719
(58) Field of Search .......................... 438/4, 680, 778, 438/786, 791, 905; 118/719, 725, 728

(56) References Cited

U.S. PATENT DOCUMENTS

| | | |
|---|---|---|
| 5,516,732 A | 5/1996 | Flegal |
| 6,162,336 A * | 12/2000 | Lee ........................ 204/298.15 |
| 6,189,483 B1 | 2/2001 | Ishikawa et al. ......... 118/723 E |
| 6,284,093 B1 | 9/2001 | Ke et al. |
| 6,352,611 B1 | 3/2002 | Han et al. .................... 156/345 |
| 6,363,624 B1 | 4/2002 | Pang et al. ..................... 34/85 |
| 6,364,957 B1 | 4/2002 | Schneider et al. .......... 118/728 |
| 6,403,491 B1 * | 6/2002 | Liu et al. ..................... 438/710 |
| 6,527,865 B1 * | 3/2003 | Sajoto et al. ............... 118/715 |
| 6,544,341 B1 | 4/2003 | Omstead et al. |

OTHER PUBLICATIONS

U.S. patent application Ser. No. 10/121,302, Carpenter et al., filed Apr. 11, 2002.

* cited by examiner

*Primary Examiner*—Alexander Ghyka
(74) *Attorney, Agent, or Firm*—Wells St. John P.S.

(57) ABSTRACT

The invention includes an engagement mechanism for semiconductor substrate deposition process kit hardware, including a body having a distal portion and a proximal portion. The body is sized for movement through a passageway of a semiconductor substrate deposition chamber through which semiconductor substrates pass into and out of the chamber for deposition processing. At least engager is mounted to the distal portion of the body The engager is sized for movement through said passageway with the body. The engager is configured to releasably engage a component of process kit hardware received within said chamber. The invention includes methods of replacing at least a portion of semiconductor substrate deposition process kit hardware. The invention includes methods of depositing materials over a plurality of semiconductor substrates. Other implementations are contemplated.

17 Claims, 7 Drawing Sheets

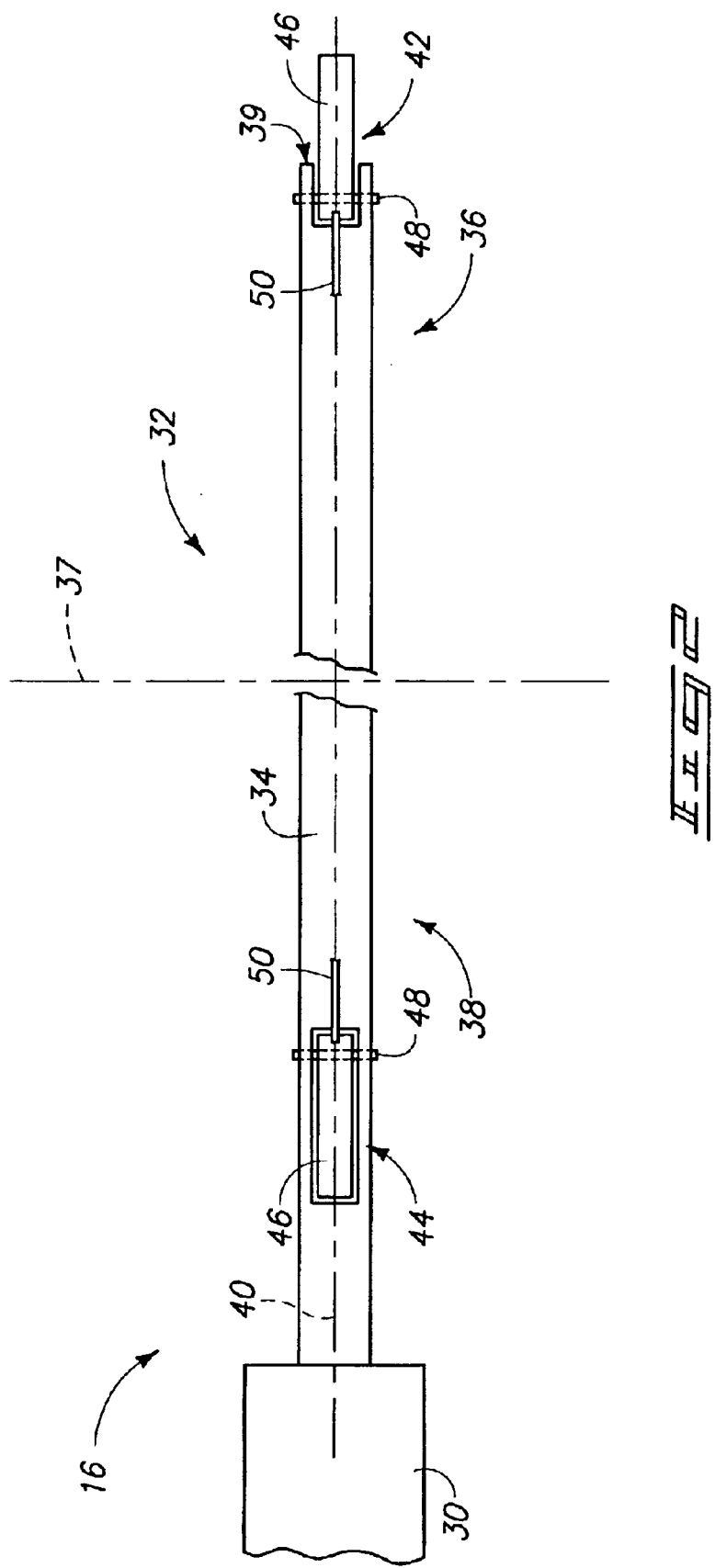

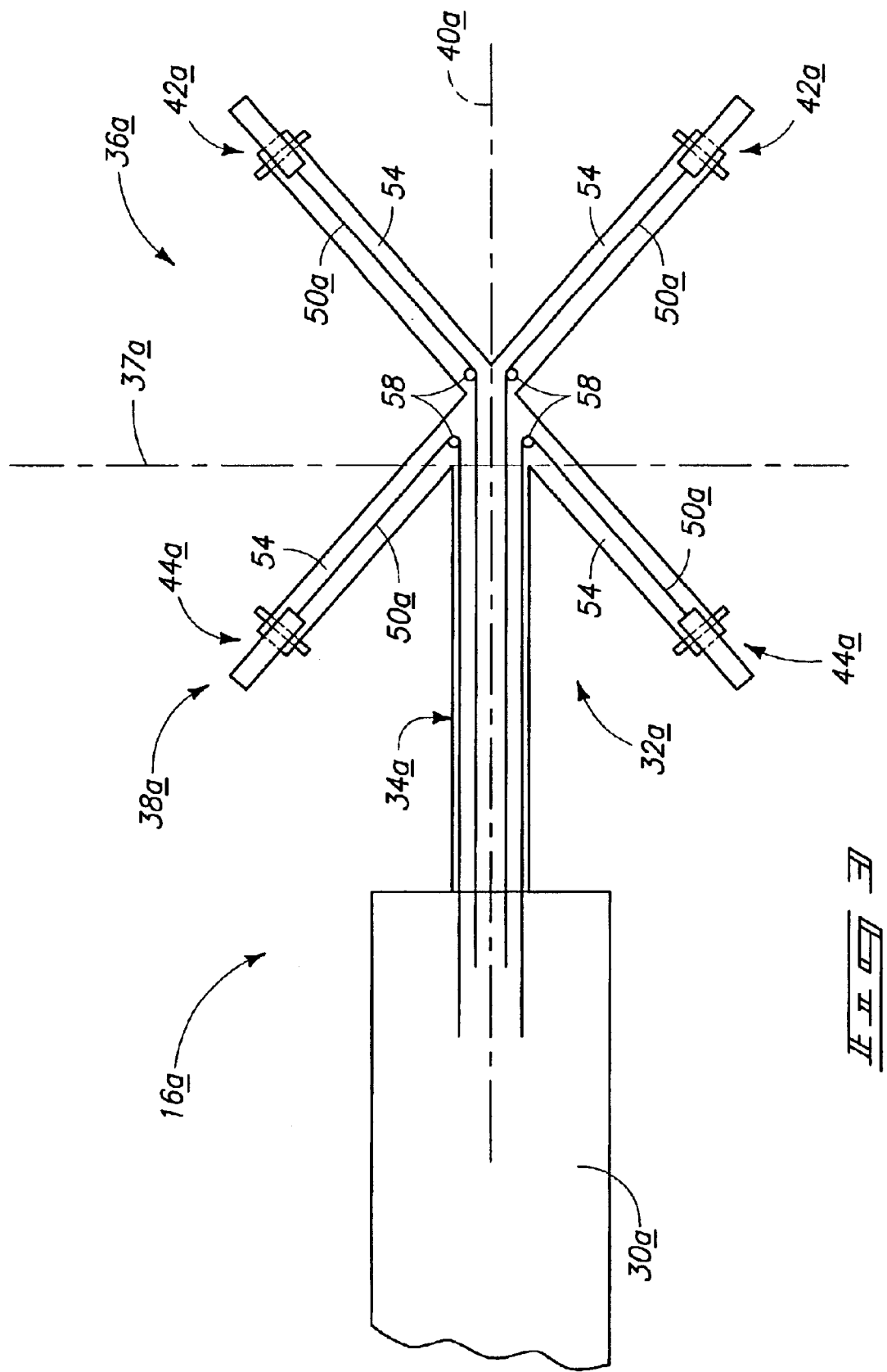

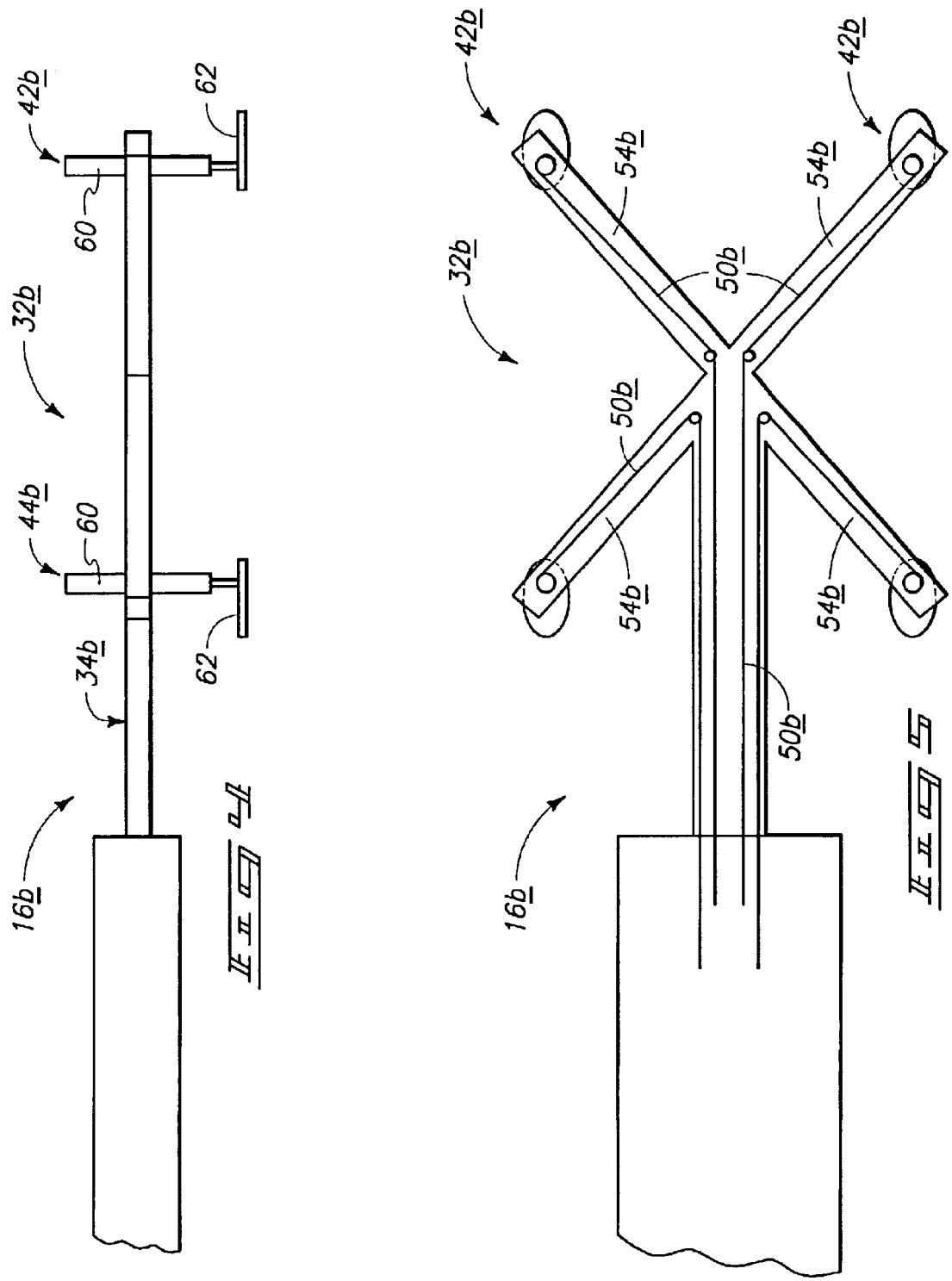

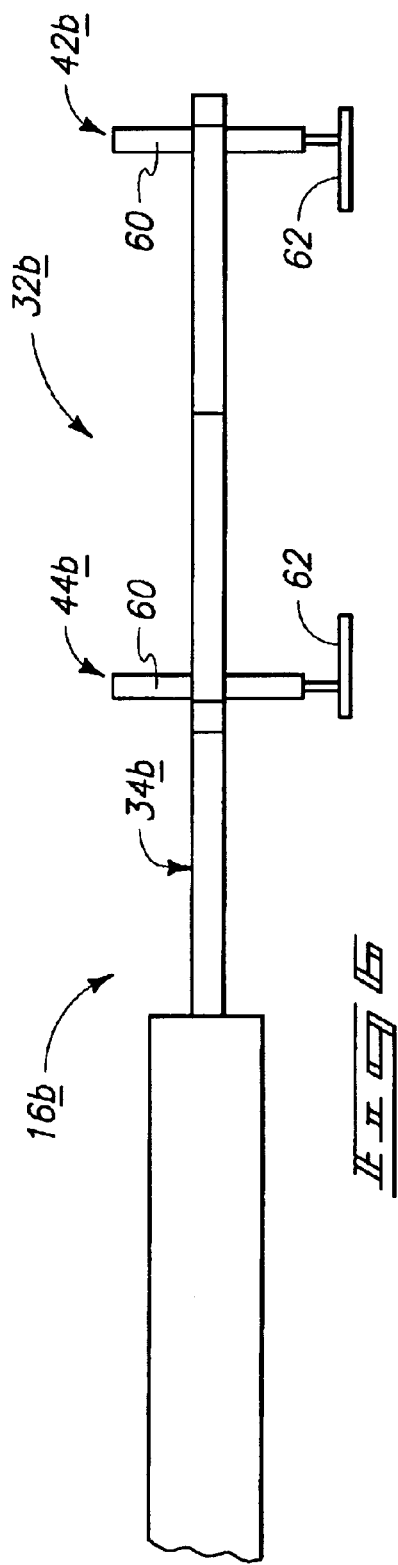
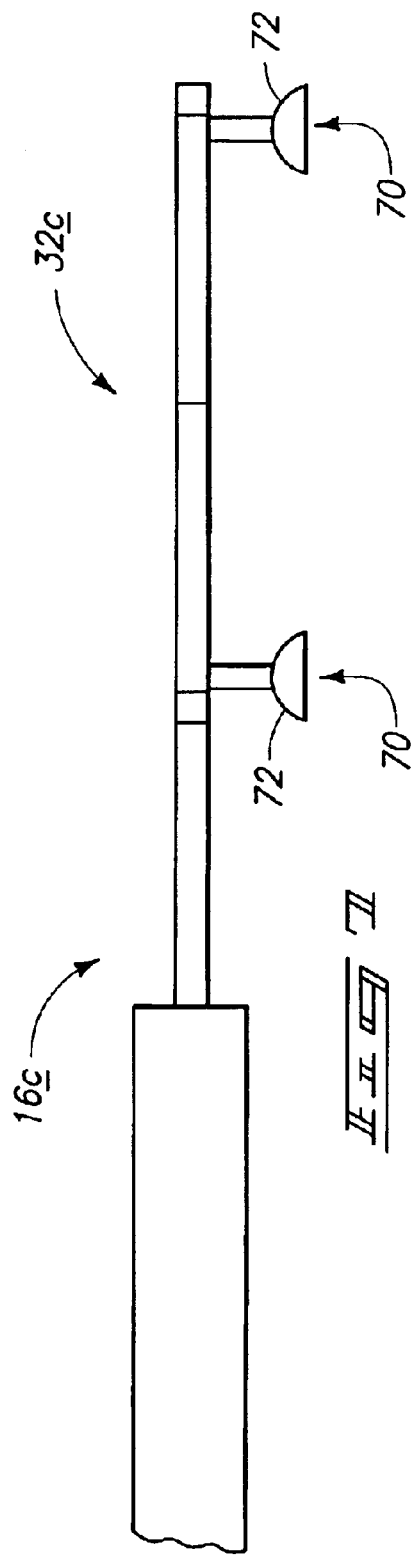

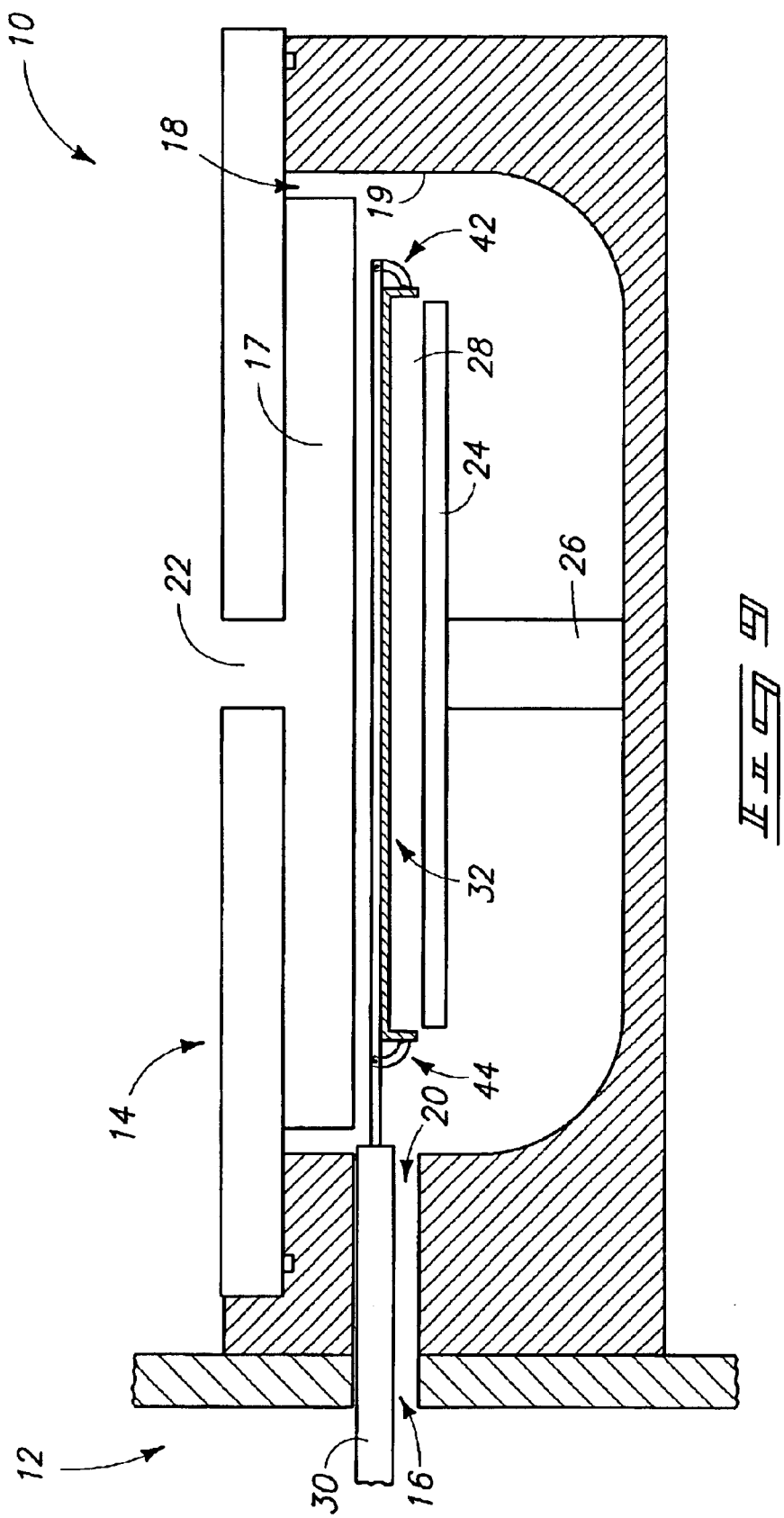

METHOD OF REPLACING AT LEAST A PORTION OF SEMICONDUCTOR SUBSTRATE DEPOSITION PROCESS KIT HARDWARE, AND METHOD OF DEPOSITING MATERIALS OVER A PLURALITY OF SEMICONDUCTOR SUBSTRATES

RELATED PATENT DATA

This application is a continuation-in-part of U.S. patent application Ser. No. 10/121,302, filed on Apr. 11, 2002, now U.S. Pat. No. 6,613,587 entitled "Method Of Replacing At Least A Portion Of A Semiconductor Substrate Deposition Chamber Liner, Method Of Depositing Materials Over A Plurality Of Semiconductor Substrates, And Semiconductor Substrate Deposition Processor Chamber Liner Apparatus", and naming Craig M. Carpenter, Ross S. Dando, Philip H. Campbell, Allen P. Mardian and Gurtej S. Sandhu as inventors. Such parent application is hereby incorporated by reference into this document as if presented in its entirety herein.

This patent resulted from a divisional application of U.S. patent application Ser. No. 10/163,671, filed Jun. 5, 2002, now U.S. Pat. No. 6,620,253 entitled "Engagement Mechanism for Semiconductor Substrate Deposition Process Kit Hardware", naming Ross S. Dando, Craig M. Carpenter, Philip H. Campbell, Allen P. Mardian and Gurtej S. Sandhu as inventors, the disclosure of which is incorporated by reference.

TECHNICAL FIELD

This invention relates to engagement mechanisms for semiconductor substrate deposition process kit hardware, to methods of replacing at least a portion of semiconductor substrate deposition process kit hardware, and to methods of depositing Materials over a plurality of semiconductor substrates.

BACKGROUND OF THE INVENTION

Semiconductor processing in the fabrication of integrated circuitry typically includes the deposition of layers on semiconductor substrates. Exemplary processes include physical vapor deposition (PVD), and chemical vapor deposition (CVD) which herein includes atomic layer deposition (ALD). With typical ALD, successive mono-atomic layers are adsorbed to a substrate and/or reacted with the outer layer on the substrate, typically by successive feeding of different precursors to the substrate surface.

Chemical and physical vapor depositions can be conducted within chambers or reactors which retain a single substrate upon a wafer holder or susceptor. The chambers include "process kit hardware" therein. In the context of this document, "process kit hardware" is defined as any physical object (except the semiconductor substrate(s) the aim of the deposition) that is received within the deposition chamber during deposition and which is removable therefrom. By way of example only, examples include removable chamber liners, focus rings, heater covers, showerheads, etc., including any component(s) thereof.

One method of replacing process kit hardware includes partial disassembly of the deposition chamber. Specifically, the lid is typically removed to provide access to process kit hardware within the chamber for its quick removal and replacement with fresh, clean hardware. The deposition processor is then reassembled for use. The spent process kit hardware can thereby be discarded or cleaned for re-use without adding to the downtime for the processor for the same. Such methods do however expose the entire deposition processor apparatus to clean room ambient conditions, thereby increasing downtime, thermal cycling and pressure cycling of the apparatus. It would be desirable to develop methods and structures that can be used to minimize or eliminate such downtime and temperature and pressure cycling.

The invention was motivated in addressing or overcoming the above-described drawbacks, although it is in no way so limited. The invention is only limited by the accompanying claims as literally worded without interpretative or other limiting reference to the specification or drawings, and in accordance with the doctrine of equivalents.

SUMMARY

The invention includes an engagement mechanism for semiconductor substrate deposition process kit hardware, methods of replacing at least a portion of semiconductor substrate deposition process kit hardware, and methods of depositing materials over a plurality of semiconductor substrates. In one implementation, such includes a body having a distal portion and a proximal portion. The body is sized for movement through a passageway of a semiconductor substrate deposition chamber through which semiconductor substrates pass into and out of the chamber for deposition processing. At least one engager is mounted to the distal portion of the body. The engager is sized for movement through said passageway with the body. The engager is configured to releasably engage a component of process kit hardware received within said chamber.

In one implementation, a method of replacing at least a portion of semiconductor substrate deposition process kit hardware includes removing at least a piece of semiconductor substrate deposition process kit hardware from a deposition chamber by passing it through a passageway to the deposition chamber through which semiconductor substrates pass into and out of the chamber for deposition processing. A replacement for the removed process kit hardware is provided into the chamber by passing the replacement through said passageway through which semiconductor substrates pass into and out of the chamber for deposition processing.

In one implementation, a method of depositing materials over a plurality of semiconductor substrates includes providing a subatmospheric deposition chamber in communication with a subatmospheric transfer chamber. A first plurality of semiconductor substrates is processed within the subatmospheric deposition chamber effective to deposit one or more materials over said first plurality, with the first plurality of substrates passing from the subatmospheric transfer chamber to the subatmospheric deposition chamber and then from the subatmospheric deposition chamber to the subatmospheric transfer chamber through a substrate passageway therebetween. After processing the first plurality of substrates, at least a piece of process kit hardware received within the subatmospheric deposition chamber is removed by passing it through the substrate passageway into the transfer chamber. A replacement for the removed piece is provided into the subatmospheric deposition chamber by passing the replacement from the subatmospheric transfer chamber through the substrate passageway into the subatmospheric deposition chamber. A second plurality of semiconductor substrates is processed within the subatmospheric deposition chamber effective to deposit said one or more materials over said second plurality. All of the first plurality processing, the removing, the providing a replacement and said second plurality processing occurs without exposing either the transfer chamber or the deposition chamber to room atmospheric pressure.

Further implementations are contemplated.

BRIEF DESCRIPTION OF THE DRAWINGS

Preferred embodiments of the invention are described below with reference to the following accompanying drawings.

FIG. 2 is an enlarged top view of a portion of the FIG. 1 apparatus.

FIG. 3 is a top view of a portion of an alternate embodiment apparatus.

FIG. 4 is a side elevational view of a portion of another alternate embodiment apparatus and shown in one operational configuration.

FIG. 5 is a top view of the FIG. 4 portion.

FIG. 6 is a side elevational view of the FIG. 4 portion shown in another operational configuration.

FIG. 7 is a side elevational view of a portion of still another alternate embodiment apparatus.

FIG. 9 is a view of the FIG. 1 portion shown in another operational configuration.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
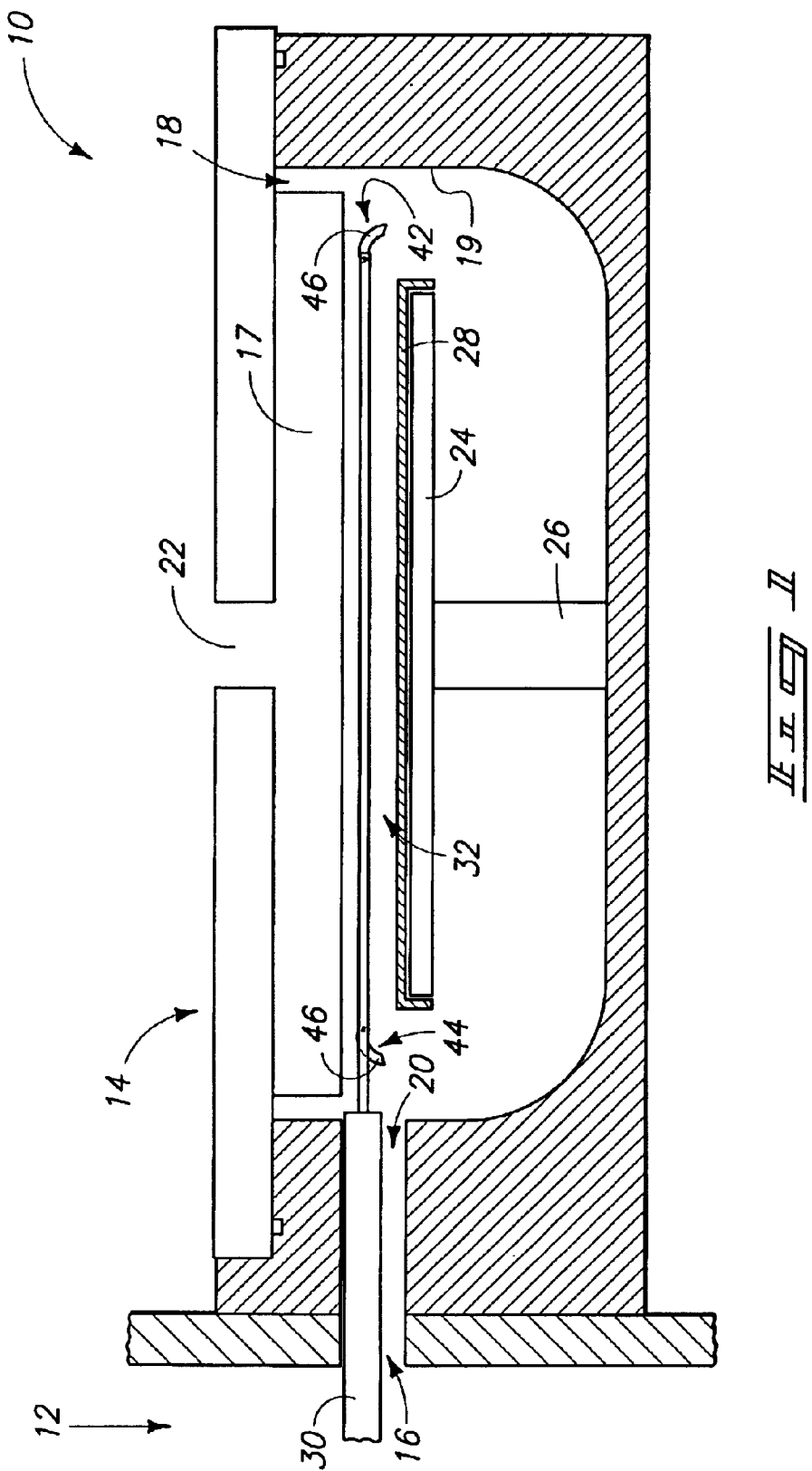
FIG. 1 is a diagrammatic sectional view of a portion of an apparatus shown in one operational configuration.

A first embodiment chemical vapor deposition apparatus is diagrammatically indicated generally in FIG. 1 with reference numeral 10. Such includes a subatmospheric transfer chamber 12 having a plurality of substrate processors or load lock chamber received thereabout, with an exemplary deposition chamber 14 being shown. Load lock chambers are utilized to transfer semiconductor substrates, typically individually, from room ambient to within processor 10 for deposition or other processing within the processing chambers. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A loading construction 16 is associated with subatmospheric transfer chamber 12 for transferring the substrates into and out of the respective processors. The illustrated deposition processor 14 includes a semiconductor substrate deposition chamber 18, which will typically be at subatmospheric pressure during deposition processing. Such includes internal wall surfaces 19. A liner apparatus (not shown) might be received proximate wall surfaces 19. In the depicted example, processor 14 is shown in the form of an ALD or other CVD processor chamber having a showerhead 17 fed by an exemplary gas inlet 22 diagrammatically shown at the top for the injecting of one or more precursor gasses to within chamber 18.

Subatmospheric deposition chamber 18 is provided in communication with subatmospheric transfer chamber 12 by or through a passageway 20. Such is an exemplary passageway through which semiconductor substrates pass into and out of chamber 18 relative to transfer chamber 12 for deposition processing. One exemplary existing passageway has a maximum height of 0.75 inch and a maximum width of 8.25 inches. Of course, the invention contemplates use with deposition chambers having passageways of these respective size dimensions or the lesser of one or both dimensions, as well as passageways having greater size in one or both dimensions.

Processor 14 includes a substrate holder or heater 24 which might be stationary or mounted for movement within chamber 18. Such is diagrammatically shown as being supported by a post support 26. A heater cover 28 is diagrammatically shown as being received over heater 24. Such might be of a disk-like shape completely covering heater 24, or be annular or of other configuration whereby less than an entirety of heater 24 is covered.

In typical existing processing, an individual wafer would be positioned from substrate transfer chamber 12 through passageway 20 and onto or otherwise over heater cover 28 utilizing an extendible arm, for example using some or a portion of construction 16. Typically, heater/support 24 includes a series of upwardly projecting and retractable pins upon which the wafer would be placed initially. The placement arm or paddle used to position substrates within chamber 18 would then be retracted from the deposition chamber through passageway 20. The pins would be lowered/retracted such that the substrate rests atop the depicted upper surface of heater cover 28 and/or heater/support 24. Then, heater/support 24 might be raised to position the wafer more proximate the showerhead. At the conclusion of deposition processing, the sequence is reversed, with the substrate being removed from chamber 18 through passageway 20.

Of course, the invention also contemplates any other deposition chamber, whether existing or yet-to-be developed, including, by way of example only, physical vapor deposition chambers.

Referring to FIGS. 2 and 3, construction 16 includes a support arm 30 having an engagement mechanism 32 associated therewith for engaging with semiconductor substrate deposition process kit hardware. In the depicted example, engagement mechanism 32 is configured for interfacing with heater cover 28 for raising and lowering it relative to heater 24 for removal and replacement from chamber 18 through substrate passageway 20. Of course, such might be usable with other deposition process kit hardware, or specifically configured/constructed for operation with other deposition process kit hardware as will be appreciated by the artisan.

Referring more specifically to FIG. 2, engagement mechanism 32 comprises a body 34 which can be considered as having a distal portion 36 and a proximal portion 38 defined by a medial line 37. Body 34 can also be considered as having or being elongated along a longitudinal axis 40. Distal portion 36 can be considered as having a distalmost end 39. Body 34 is sized for movement through passageway 20 of semiconductor substrate deposition chamber 14 through which semiconductor substrates pass into and out of the chamber for deposition processing.

One aspect of the invention contemplates at least one engager mounted to the distal portion of the body. The engager is sized for movement through the passageway with the body, and is configured to releasably engage a component of process kit hardware received within the deposition chamber. The first depicted preferred embodiment comprises a first mechanical engager 42 mounted to distal portion 36 of body 34 for movement relative thereto, and a second mechanical engager 44 mounted to proximal portion 38 of body 34 for movement relative thereto. Mechanical engager 42 is mounted to extend beyond distalmost end 39. Such first and second mechanical engagers are sized for movement through passageway 20 with body 34. Such engagers are of common construction relative to one another, are diametrically opposed, and mounted for movement towards and away from one another by rotational movement relative to body 34, and as shown for eccentric rotational movement relative to body 34. Further in the depicted exemplary embodiment, mechanical engagers 42, 44 are depicted as being in the shape of hook-like or claw-like bodies 46, which are mounted for rotational/pivotal movement relative to body 34 via respective pivot pins 48. Such define the respective axes of rotation relative to body 34, which are each both generally transverse to longitudinal axis 40 and horizontal.

An engagement arm or cable 50 is diagrammatically shown connected to the respective ends of engager bodies 46 for actuating the mechanical engagers between a fully open/unengaged position (FIG. 1) and a process kit hardware engaged position (FIG. 9). Cables/arms 50 would operatively extend relative to construction 30 via, by way of example only, pulleys, bell cranks, etc., and by way of example only as shown in subsequently described embodiments.

An alternate exemplary embodiment is described with reference to FIG. 3. Like numerals from the first-described embodiment are utilized where appropriate, with differences being indicated with the suffix "a" or with different numerals. Body 34*a* of engagement mechanism 32*a* includes four arms 54 connected at/integral with distal portion 36*a*. The respective arms 54 can be considered as having respective proximal portions and distal portions, with engagers mounted to the respective distal portions thereof. The engagers are collectively configured to releasably engage a component of process kit hardware received within a semiconductor substrate deposition chamber, with the support/body arms and engagers collectively being sized for movement through the chamber passageway through which semiconductor substrates pass into and out of the chamber for deposition processing.

In the FIG. 3 depicted example, mechanical engagers 42*a* are mounted to extend beyond the distal ends of arms 54 within distal portion 36*a*, and mechanical engagers 44*a* are mounted to the distal portions of arms 54 within proximal portion 38*a*. The depicted exemplary mechanical engagers 42*a*, 44*a* are of the same general construction of those depicted in FIGS. 1 and 2, with exemplary actuators 50*a* being in the form of cables which route relative to pulleys 58. Accordingly, the depicted embodiment comprises multiple of first mechanical engagers 42*a* and multiple of second mechanical engagers 44*a*.

FIGS. 4 and 5 depict an alternate exemplary engagement mechanism 32*b*. Like numerals from the first-described embodiment are utilized where appropriate, with differences being indicated with the suffix "b" or with different numerals. FIGS. 4 and 5 depict mechanical engagers 42*b* and 44*b* as comprising vertically-oriented rods 60 mounted for rotation relative to arms 54*b*. Accordingly, such engagers are each mounted for rotational movement relative to body 34*b* which is both generally transverse longitudinal axis 40*b* and which is vertical. A disk or arm 62 is eccentrically mounted to a lower portion of rod 60. Accordingly, actuator arms/cables 50*b* can move disks/arms 62 from a position where they project opposingly outward (FIG. 4) to a position where they project opposingly inward (FIG. 6). Such could be used relative to engaging any suitably configured process kit hardware within a deposition chamber. The illustrated arms 62 could also of course project in the same direction, in different directions from that shown, operate independently, operate dependently, etc.

By way of example only, FIGS. 1–6 and 9 are depictive of exemplary mechanical engagers for releasably engaging process kit hardware within a substrate deposition chamber. Any other mechanical engagers are contemplated, also, whether existing or yet-to-be developed, in the context of the various claim combinations. In structural and methodical aspects, the invention contemplates non-mechanical engagers and engagements, also, whether existing or yet-to-be developed, in the various claim combinations, for example, and by way of example only, magnetic engagers or vacuum/suction engagers.

Figure 8:
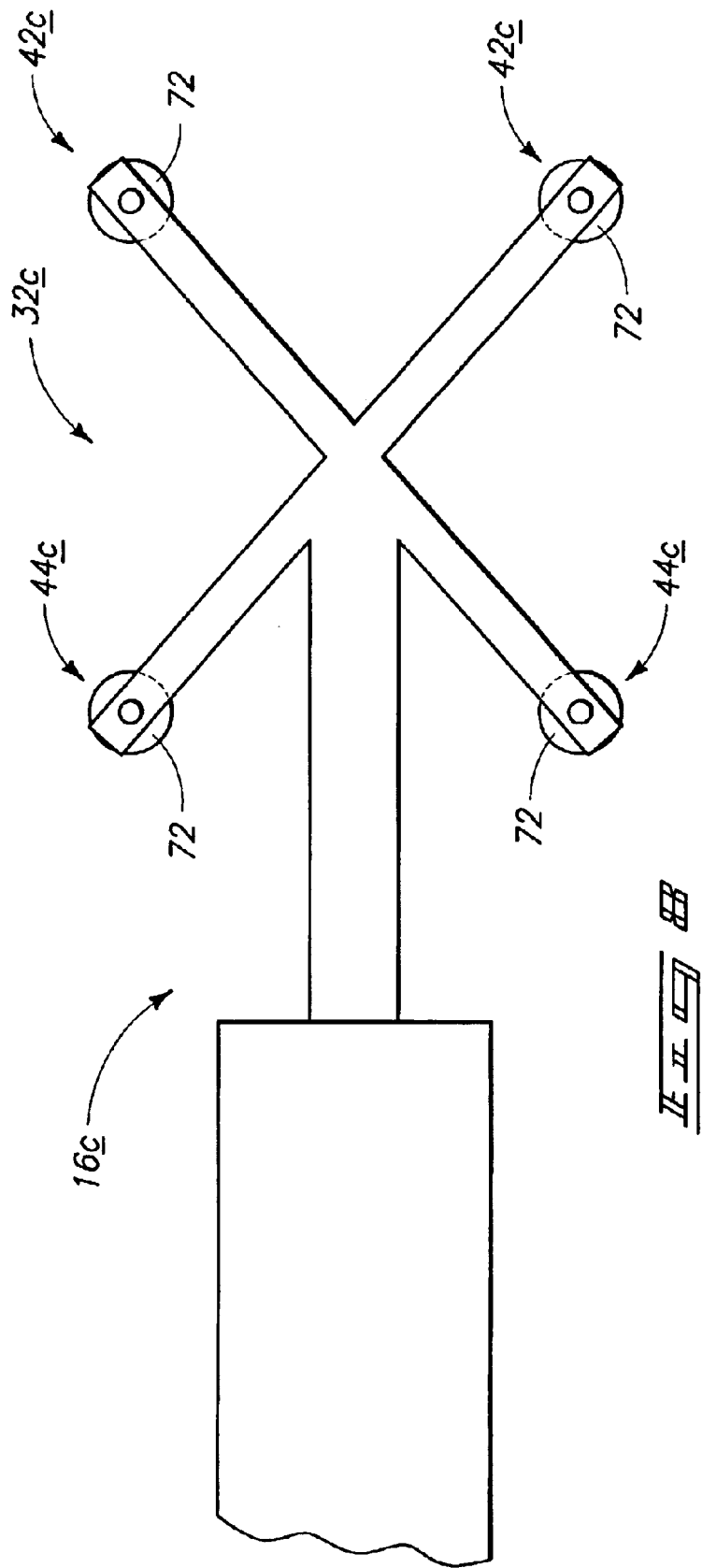
FIG. 8 is a top view of the FIG. 7 portion.

For example, FIGS. 7 and 8 depict another exemplary alternate embodiment engager 32*c*. Like numerals from the first-described embodiments are utilized where appropriate, with differences being indicated with the suffix "c" or with different numerals. Such depicts an engagement mechanism 16*c* comprising a plurality of suction openings 70 associated with the body for movement through passageway 20, with such openings being configured to releasably engage a component of process kit hardware received within the chamber. In the depicted preferred embodiment, suction openings 70 comprise flexible suction cups 72, and are oriented generally transverse a longitudinal orientation of body 34*c*. Suction openings 70 are depicted as being even in number, and arranged in diametrically opposing pairs. Alternate orientations and constructions are of course contemplated.

The invention contemplates a method of replacing at least a portion of semiconductor substrate deposition process kit hardware essentially independent of the preferred embodiment apparatus just described. One exemplary implementation includes removing at least a piece of semiconductor substrate deposition process kit hardware from a deposition chamber by passing it through a passageway to the deposition chamber through which semiconductor substrates pass into and out of the chamber for deposition processing. The piece might, of course, be folded or otherwise manipulated depending upon size and construction to enable such to fit through the chamber passageway if such in an operable or other state is too large for such passageway. Regardless, a replacement for the removed process kit hardware is provided into the chamber by passing the replacement through the passageway through which semiconductor substrates pass into and out of the chamber for deposition processing. Most preferably, the deposition chamber is maintained at subatmospheric pressure during the removing and the providing of the replacement, and any time therebetween. Even further most preferably, the deposition chamber is maintained at a substantially constant subatmospheric pressure during the removing of the piece and the providing of the replacement, and any time therebetween. Preferred embodiments of this disclosure are described with reference to the piece comprising a heater cover or portion thereof, although any deposition process kit hardware is contemplated, for example that described above and in the parent patent application incorporated herein by reference.

The invention contemplates a method of depositing materials over a plurality of semiconductor substrates, also. By way of example only, such method includes providing a subatmospheric deposition chamber in communication with the subatmospheric transfer chamber. A first plurality of semiconductor substrates is processed within the subatmospheric deposition chamber effective to deposit one or more materials over the first plurality. Typically, individuals of the first plurality of substrates are separately deposited upon within the chamber. Regardless, the first plurality of substrates pass from the subatmospheric transfer chamber to the subatmospheric deposition chamber and then from the subatmospheric deposition chamber to the subatmospheric transfer chamber through a substrate passageway therebetween.

After processing the first plurality of substrates, at least a piece of process kit hardware received within the subatmospheric deposition chamber is removed by passing it through the substrate passageway into the transfer chamber. A replacement for the removed piece is provided into the subatmospheric deposition chamber by passing the replacement from the subatmospheric transfer chamber through the substrate passageway into the subatmospheric deposition chamber. A second plurality of semiconductor substrates within the subatmospheric chamber are processed effective to deposit one or more materials over the second plurality. All of the first plurality processing, the removing, the providing of a replacement, and the second plurality processing occur without exposing either the transfer chamber or the deposition chamber to room atmospheric pressure.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of replacing at least a portion of semiconductor substrate deposition process kit hardware, comprising:
    removing at least a piece of semiconductor substrate deposition process kit hardware from a deposition chamber by passing it through a passageway to the deposition chamber through which semiconductor substrates pass into and out of the chamber for deposition processing; and
    providing a replacement for the removed process kit hardware into the chamber by passing the replacement through said passageway through which semiconductor substrates pass into and out of the chamber for deposition processing.

2. The method of claim 1 wherein the piece comprises a heater cover.

3. The method of claim 1 wherein the deposition chamber is maintained at subatmospheric pressure during the removing and the providing, and between the removing and the providing.

4. The method of claim 1 wherein the deposition chamber is maintained at a substantially constant subatmospheric pressure during the removing and the providing, and between the removing and the providing.

5. A method of replacing at least a portion of semiconductor substrate deposition process kit hardware, comprising:
    engaging a piece of semiconductor substrate deposition process kit hardware with an arm extending through a passageway to the deposition chamber through which semiconductor substrates pass into and out of the chamber for deposition processing;
    moving the engaged piece with the arm to proximate said passageway;
    removing the piece from the deposition chamber with the arm by passing the piece through the passageway; and
    providing a replacement for the removed piece into the chamber by passing the replacement through said passageway with the arm.

6. The method of claim 5 wherein the piece comprises a heater cover.

7. The method of claim 5 wherein the deposition chamber is maintained at subatmospheric pressure during the removing and the providing, and between the removing and the providing.

8. The method of claim 5 wherein the deposition chamber is maintained at a substantially constant subatmospheric pressure during the removing and the providing, and between the removing and the providing.

9. The method of claim 5 comprising a mechanical engager movably mounted proximate a distal end of the arm, the engaging comprising moving the mechanical engager relative to the arm effective to mechanically engage the piece.

10. The method of claim 5 comprising at least two mechanical engagers movably mounted proximate a distal end of the arm, the engaging comprising moving the mechanical engagers relative to the arm effective to mechanically engage the piece.

11. The method of claim 5 comprising a suction opening received proximate a distal end of the arm, the engaging comprising applying a vacuum force against the piece from the suction opening.

12. The method of claim 5 comprising a flexible suction cup received proximate a distal end of the arm, the engaging comprising applying a vacuum force against the piece from the suction cup.

13. A method of depositing materials over a plurality of semiconductor substrates, comprising:
    providing a subatmospheric deposition chamber in communication with a subatmospheric transfer chamber;
    processing a first plurality of semiconductor substrates within the subatmospheric deposition chamber effective to deposit one or more materials over said first plurality, said first plurality of substrates passing from the subatmospheric transfer chamber to the subatmospheric deposition chamber and then from the subatmospheric deposition chamber to the subatmospheric transfer chamber through a substrate passageway therebetween;
    after processing the first plurality of substrates, removing at least a piece of process kit hardware received within the subatmospheric deposition chamber by passing it through the substrate passageway into the transfer chamber;
    providing a replacement for the removed piece into the subatmospheric deposition chamber by passing the replacement from the subatmospheric transfer chamber through the substrate passageway into the subatmospheric deposition chamber; and
    processing a second plurality of semiconductor substrates within the subatmospheric deposition chamber effective to deposit said one or more materials over said second plurality; all of said first plurality processing, said removing, said providing a replacement and said second plurality processing occurring without exposing either the transfer chamber or the deposition chamber to room atmospheric pressure.

14. The method of claim 13 wherein the piece comprises a heater cover.

15. The method of claim 13 wherein the first and second plurality processings are one substrate at a time.

16. The method of claim 13 wherein the deposition chamber is maintained at a substantially constant subatmospheric pressure during said all.

17. The method of claim 13 comprising removing and replacing multiple pieces of said process kit hardware through said passageway intermediate the first plurality processing and the second plurality processing.

* * * * *

UNITED STATES PATENT AND TRADEMARK OFFICE
CERTIFICATE OF CORRECTION

PATENT NO.   : 6,787,373 B2
DATED        : September 7, 2004
INVENTOR(S)  : Dando et al.

It is certified that error appears in the above-identified patent and that said Letters Patent is hereby corrected as shown below:

Title page,
Item [57], ABSTRACT,
Line 7, please insert -- the -- after "least".
Line 8, please delete "body" after "the" and insert -- body. --.

Signed and Sealed this

Twenty-eighth Day of June, 2005

JON W. DUDAS
*Director of the United States Patent and Trademark Office*